(12) United States Patent
Ries

(10) Patent No.: US 6,658,240 B1
(45) Date of Patent: Dec. 2, 2003

(54) MULTIBAND FREQUENCY GENERATION DEVICE AND RELATED METHOD

(75) Inventor: Christian Ries, Nuremberg (DE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/373,546

(22) Filed: Aug. 13, 1999

(30) Foreign Application Priority Data

Aug. 17, 1998 (DE) .......................................... 198 37 204

(51) Int. Cl.[7] .................................................. H04B 1/18
(52) U.S. Cl. ................................ 455/183.1; 455/165.1; 455/76; 455/168.1; 331/1
(58) Field of Search ......................... 455/180.1, 165.1, 455/183.1, 186.1, 307, 280, 188.1, 164.1, 76, 180.3, 260, 264; 327/554; 331/1

(56) References Cited

U.S. PATENT DOCUMENTS

| | | | | |
|---|---|---|---|---|
| 3,927,384 A | | 12/1975 | Jezo | |
| 4,236,251 A | * | 11/1980 | Ohgishi et al. | 455/165.1 |
| 4,885,551 A | * | 12/1989 | Myer | 330/151 |
| 5,103,192 A | | 4/1992 | Sekine et al. | |
| 5,202,906 A | | 4/1993 | Saito et al. | |
| 5,610,559 A | * | 3/1997 | Dent | 331/2 |
| 5,806,038 A | * | 9/1998 | Huang et al. | 704/258 |
| 6,229,399 B1 | * | 5/2001 | Tobise et al. | 331/2 |
| 6,466,768 B1 | * | 10/2002 | Agahi-Kesheh et al. | 455/183.2 |

FOREIGN PATENT DOCUMENTS

DE        2607530 C2    9/1977

* cited by examiner

Primary Examiner—Edward F. Urban
Assistant Examiner—Tilahun Gesesse
(74) Attorney, Agent, or Firm—Nixon & Vanderhye

(57) ABSTRACT

To avoid any dead time when switching between different frequency bands it is proposed to set a programmable multiband frequency synthesizer unit (12) adapted to generate an output signal in at least two frequency bands into a sleep mode before switching to a new frequency band, then to program the programmable multiband frequency synthesizer unit (12) according to the new frequency band, and finally to activate the programmable multiband frequency synthesizer unit (12) for operation in the new frequency band.

16 Claims, 15 Drawing Sheets

FIG.5
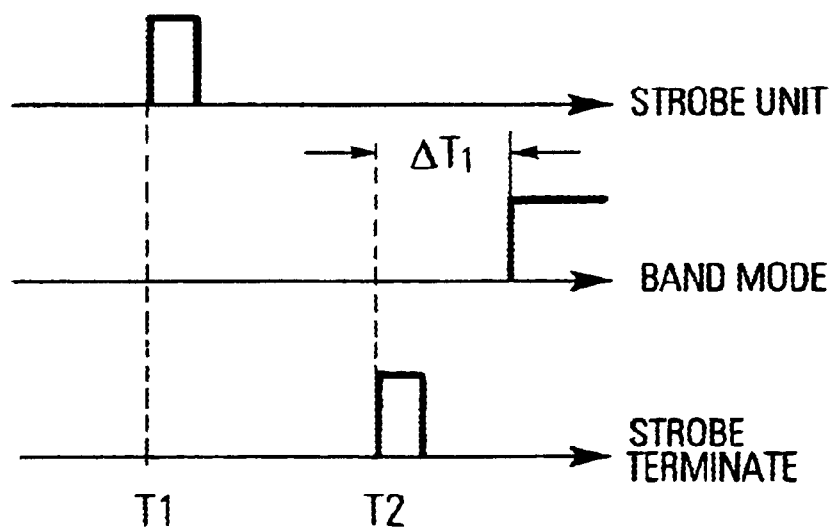
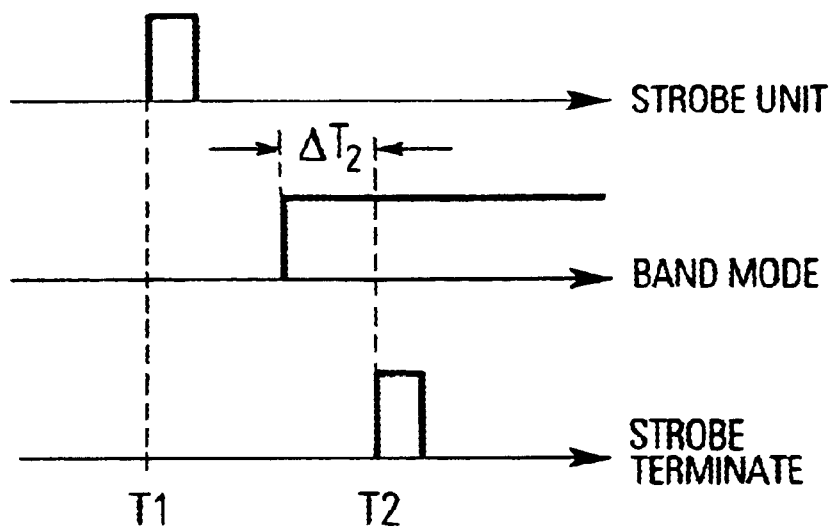

MULTIBAND FREQUENCY GENERATION DEVICE AND RELATED METHOD

FIELD OF INVENTION

The present invention relates to the dead time reduction for multiband synthesizer frequency jumps. In particular, the present invention relates to the dead time reduction for multiband synthesizers allowing to generate output signals in at least two frequency bands.

BACKGROUND OF INVENTION

Multiband synthesizer units are typically used in mobile phones. Here, the output signal of the multiband synthesizer is supplied to different mixer stages for sending and receiving signals in mobile phones, e.g., for the modulation of sending signals and the demodulation of received signals.

FIG. 11 shows a related frequency generation unit 200. Here, the object is to tune the frequency of a voltage-controlled oscillator 202 after frequency division thereof such that it is coincident to a frequency of a basic oscillator 204. As shown in FIG. 11, the basic oscillator 204 comprises a reference oscillator 206 that feeds a first programmable divider 208 to convert the frequency generated in the reference oscillator 206 into a control frequency for the operation of the voltage-controlled oscillator 202.

As also shown in FIG. 11, a second programmable divider 210 is provided to convert the frequency generated by the voltage-controlled oscillator 202 into a frequency suitable for comparison with the reference frequency of the basic oscillator 204. A phase detector 212 enables a comparison of the output signal of the second programmable divider 210 and the reference frequency. A detected phase error is then supplied to a loop filter 214 wherein an integration takes place. Using this integrated error signal the voltage-controlled oscillator 202 is controlled until the phase difference vanishes. Usually, the first programmable divider 208, the second programmable divider 210 and the phase detector 212 form the frequency synthesizer 216 of the frequency generation unit 200 of the PLL type.

FIG. 12 shows the embedding of this frequency generation unit 200 into a single band frequency generation device.

As shown in FIG. 12, the frequency generation unit 200 is connected to a control unit 218 provided for the operation and the programming of the frequency generation unit 200. This control unit 218 supplies different control signals and programming data signals to the frequency generation unit 200 either during operation or programming thereof.

Therefore, there is provided a signal line for the selection of an appropriate channel in the frequency band and a programming strobe line to indicate a programming mode. In case the programming strobe signal is supplied related data for the programming of the first programmable divider 208 and the second programmable divider 210 are supplied to the frequency generation unit 200 so as to select an appropriate channel in the single frequency band.

Still further, in case the frequency generation unit 200 should not output a frequency signal, it is set into the standby mode via the standby control line to reduce the amount of power consumed in the frequency generation unit 200.

After reprogramming of the frequency generation unit 200 a phase detector 212 detects a phase difference between the signals at the outputs of the first programmable divider 208 and the second programmable divider 210. Therefore, the phase detector 212 will drive the loop filter 214 until this phase difference vanishes. In other words, during the transition from the previously programmed output frequency to the newly programmed output frequency, there exists a transition time period wherein the phase detector drives the loop filter 214 such that the voltage-controlled oscillator 202 is tuned to the newly programmed operation frequency.

To this end, the phase detector comprises two parts, i.e. the actual phase difference detector and a charge pump (not shown).

As shown in FIG. 13, the phase detector unit works on the zero crossings of the input signals to the phase detector 212. One solution is to output a pulse with the same length as the time difference between the zero crossings of the input signals. In other words, this means that the output of the phase detector unit is proportional to the phase difference of the input signals supplied thereto.

Further, the phase detector unit has two different outputs, one for a positive phase difference and one for a negative phase difference. The respective output signals are supplied to a related charge pump that produces positive and negative current pulses with constant amplitude but different length which may then be processed through the loop filter 214.

In case the frequency generation unit 200 is locked to the frequency specified through the control unit 218, the phase detector 212 works in its linear region, as shown in FIG. 14. Before the frequency generation unit 200 is locked, the non-periodic behaviour of the phase detector 212 will force the frequency of the voltage-controlled oscillator 202 into the linear region of the phase detector 212 so that a locking of the frequency generation unit 200 is always guaranteed. For large initial frequency errors the phase detector operates in a frequency discriminator mode. Once the error is within the linear pull-in-range, it operates as a coherent phase detector, as shown in FIG. 14.

While the design illustrated with respect to FIG. 11 to FIG. 14 is adapted to, e.g., mobile phones being operated in a single frequency band this single band operation is no longer suitable for the increasing number of subscribers and the limited number of communication channels in existing cellular mobile networks. To the contrary, a combination of technical advantages being related to different frequency bands seems to be necessary, e.g., in particular through providing multiband cellular networks and multiband mobile phones being related thereto through combining, e.g., the GSM 900, GSM 1800 and PCS frequency bands, respectively.

However, a prerequisite is an effective frequency generation in a plurality of frequency bands and in particular an effective transition between these frequency bands within minimal time periods.

As shown in FIG. 15 wherein those parts being identical to those shown in FIG. 11 are denoted with same reference numerals, one approach is to use a plurality of voltage-controlled oscillators 220-1, . . . , 220-n, i.e. one voltage-controlled oscillator for each frequency band of the multiband frequency generation unit 222. The output of each voltage-controlled oscillator 220-1, . . . , 220-n is then coupled to the input of the second programmable divider via a coupling unit 224 achieving an appropriate supply of the output signals of the voltage-controlled oscillators 220-1, . . . , 220-n to the second programmable divider 210.

FIG. 16 shows a further approach to the multiband frequency generation that differs over the frequency generation unit as shown in FIG. 15 in that a loop filter 214-1, . . . , 214-n is provided for each of the voltage-controlled oscillators 220-1, . . . , 220-n. This leads to an additional advantage in that the transient behaviour for each single frequency band may be determined separately in compliance with frequency band specific requirements.

Therefore, using either approach shown in FIG. 15 or FIG. 16, it is not only necessary to switch between different channels in a single frequency band but also to switch between different bands in the frequency generation unit or equivalently to carry out frequency band jumps. This may require a re-programming of the first programmable divider 206 and the second programmable divider 210, and further to switch off the voltage-controlled oscillator in the old frequency band and to switch on the voltage-controlled oscillator in the new frequency band.

One example for such a transition would occur in a mobile phone that during a single GSM TDMA frame is active on three time slots. One is used for receiving, one for transmitting, and one for monitoring, respectively. While receive and transmit are usually carried out in the same frequency band, monitoring can either be in the same frequency band as receive and transmit or in a different frequency band. Therefore, the time between these slots determines the demand on the lock-in time in the frequency generation unit. In GSM mobile phone applications the most difficult transition occurs between monitoring and receive and must be carried out in the range of some hundred microseconds so that timing for this transition is highly critical.

However, as the approach outlined above with respect to FIG. 15 and FIG. 16 does not comprise any measures to coordinate the transition between the different frequency bands it may happen that the frequency synthesizer 216 is already programmed for the new frequency band although the voltage-controlled oscillator of the old frequency band is still active. Certainly, it is also possible that the situation is reversed, i.e. that the frequency synthesizer is still programmed for the old frequency band while the voltage-controlled oscillator for the new frequency band is already switched on.

In both cases, it is attempted to tune the currently active voltage-controlled oscillator to a frequency lying outside its specified frequency range such that the phase difference detected by the phase detector 212 gets excessively large. In other words, if a mismatch between the activated voltage-controlled oscillator and the programming of the programmable dividers exists in the frequency generation unit the steering output of the frequency synthesizer 216 goes to its tuning limit thereby losing its phase detector gain.

The result is a relatively long delay time, equivalently referred to as dead time, after the frequency synthesizer gets finally programmed to the suitable frequency band or the appropriate voltage-controlled oscillator gets switched on. Therefore, this mismatch leads to a significant impact on the lock-in time of the frequency generation unit as will be shown in the following with respect to FIG. 17 and FIG. 18.

According to the example shown in FIG. 17, a change of frequency bands is necessary from a first frequency band I to a second frequency band II. Here, as the voltage-controlled oscillator I gets switched off, the voltage-controlled oscillator II gets switched on, but for a short period of time the frequency synthesizer 216 is still programmed for the first frequency band I. This leads to a steering output of the loop filter 214 as shown in FIG. 17, where the different times may be classified as follows:

$T_1$: voltage-controlled oscillator I gets switched off; voltage-controlled oscillator II gets switched on;

$T_2$: the programmable dividers get programmed according to frequency band II, start of dead time;

$T_3$: end of dead time, normal lock-in begins;

$T_4$: the voltage-controlled oscillator II has finally reached the programmed frequency; and $T_i$: the charge pump of the phase detector 212 loses its charge pump gain due to saturation.

Therefore, the example shown in FIG. 17 relates to the transition from a lower frequency band I to the higher frequency band II, e.g., from GSM 900 to GSM 1800 in a mobile phone. Further, the voltage-controlled oscillators are switched before the programming is finished. Therefore, the control circuit tries to tune the voltage-controlled oscillator II for the higher frequency band to the still prevailing programming for the lower frequency band. For this reason, the control voltage at the input of the second voltage-controlled oscillator II goes down to a minimum value between time $T_1$ and time $T_i$. At time $T_i$ the charge pump in the phase detector 212 reaches saturation and therefore loses its charge pump gain. This is the reason why at time $T_2$ the locking-in does not start immediately. To the contrary, during the dead time between time $T_2$ and time $T_3$ it is necessary to bring the charge pump out of saturation and only then does the actual locking-in start at time $T_3$.

A similar example illustrated in FIG. 18 occurs in case a transition is carried out from a higher frequency band II to a lower frequency band I and the programming of the programmable dividers in the frequency synthesizer 216 is only finished after the switching of the voltage-controlled oscillators. The times shown in FIG. 18 may be classified as follows:

$T_1$: voltage-controlled oscillator II gets switched off and voltage-controlled oscillator I gets switched on;

$T_2$: programming of programmable dividers for frequency band I is finished, start of dead time;

$T_3$: end of dead time, begin of normal lock-in;

$T_4$: the voltage-controlled oscillator I has finally reached the correct frequency;

$T_i$: charge pump in phase detector 212 is reaching saturation.

As shown in FIG. 18, according to this example the frequency generation unit at the start of the transition tries to tune the voltage-controlled oscillator for the lower frequency band I to the still prevailing programming for the higher, second frequency band so that the steering output for the first voltage-controlled oscillator for the lower frequency band is rising to the maximum value between time $T_1$ and time $T_i$. Therefore, at time $T_2$, when the programming for the lower frequency band I is finally finished, it is necessary to bring the charge pump in the phase detector out of saturation during the dead time between time $T_2$ and time $T_3$ before the actual locking-in begins at time $T_3$ and ends at time $T_4$.

It should be noted that the same effects as outlined above with respect to FIG. 17 and to FIG. 18 occur in case the programming in the frequency synthesizer is finished prior to the switching off the voltage-controlled oscillators.

SUMMARY OF INVENTION

In view of the above, the object of the invention is to avoid any dead time when switching between different frequency bands in a multiband frequency generation device.

According to the present invention, this object is achieved through a multiband frequency generation device, comprising a programmable multiband frequency synthesizer means to generate an output signal in at least two frequency bands, a control means adapted to operate and program the multiband frequency synthesizer means, respectively, wherein the control means sets the multiband frequency synthesizer means into a sleep mode during the programming thereof.

Therefore, the multiband frequency generation device according to the present invention avoids that a charge pump of the phase detector in the frequency generation unit runs into saturation during programming of the programmable multiband frequency synthesizer means. The reason for this is that the multiband frequency synthesizer means is deactivated or equivalently set into a sleep mode during the programming thereof such that no control operation steps are carried out during the programming. In consequence, the saturation of any charge pump in the phase detector outlined above may be completely avoided since a tuning of voltage-controlled oscillators is only carried out in case the frequency synthesizer is programmed appropriately. Therefore, the transition time between different frequency bands is reduced significantly thus increasing the range of possible applications with stringent timing requirements for the inventive multiband frequency generation device.

According to a preferred embodiment of the present invention the control means is adapted to initialize the sleeping mode slightly before the programming of the multiband frequency synthesizer means begins and to terminate the sleeping mode slightly after the programming of the multiband frequency synthesizer means terminates.

Therefore, as safety margins are provided at the beginning and the termination of the programming, any undefined operation conditions may be strictly avoided.

According to yet another preferred embodiment of the present invention, the multiband frequency synthesizer means comprises a voltage-controlled multiband oscillator to generate an output signal in each frequency band, and the control means comprises a sleep mode setting means adapted to maintain a steering signal for the control of the voltage-controlled multiband oscillator on a constant level during the sleep mode. Preferably, this object is achieved through a sleep mode setting means being adapted to set the power save control signal of the multiband frequency synthesizer means in order to maintain the steering signal for the control of the voltage-controlled multiband oscillator on a constant level during the sleep mode. This may for example be achieved by setting the output of the charge pump into a high impedance state. Also, the sleep mode may be set via programming instead of the issuance of a hardware signal.

Thus, this solution may be implemented without any hardware changes using the existing means for the control of the multiband frequency synthesizer means. Here, the standby mode usually provided for to save power during standby of the multiband frequency generation device is used to put this device into a sleep mode during programming thereof.

The same advantage arises in case the multiband frequency synthesizer means has a dedicated input for the control of the loop filter which may then alternatively be used to set the multiband frequency generation device into the sleep mode during programming.

According to yet another preferred embodiment, the sleep mode setting means comprises a programming strobe pulse spreading means adapted to receive a programming strobe pulse and to spread this pulse according to a predefined time period, and first switching means adapted to connect the power save control input terminal of the multiband frequency synthesizer means to ground during the predefined time period in response to the output signal of the programming strobe pulse spreading means.

This embodiment is advantageous in that the operation of the control unit in the multiband frequency generation device must not carry out the setting of the multiband frequency synthesizer means into the sleep mode. To the contrary, this is achieved automatically after issuance of a programming strobe signal which is available anyway.

According to yet another preferred embodiment, the sleep mode setting means comprises a first edge detecting means to detect a transition in a frequency band selection signal and second switching means adapted to connect the power save control input terminal of the multiband frequency synthesizer means to ground during the predefined time period in response to the output signal of the first edge detecting means.

Therefore, this implementation relies on a mode selection signal provided for the selection of the frequency band. Using this information, it is possible to avoid any activation of the sleep mode setting means at a time other than the transition between different frequency bands.

Finally, according to yet another preferred embodiment of the present invention, the sleep mode setting means comprises a second edge detecting means to detect an upward transition in a frequency band selection signal, third switching means adapted to connect the power save control input terminal of the multiband frequency synthesizer means to ground during the predefined time period in response to the output signal of the second edge detecting means, third edge detecting means adapted to detect a downward transition in a frequency band selection signal, and fourth switching means adapted to connect the power save control input terminal of the multiband frequency synthesizer means to ground during a predefined period of time in response to the output signal of the third edge detecting means. Preferably, the second and third edge detecting means are capacitors.

Therefore, the multiband frequency synthesizer means is set into the sleep mode only during programming thereof. Also, this setting can be achieved very cost-efficiently using capacitors to differentiate the frequency band selection signal to control a switch connecting the power save control input terminal to ground during programming of the multiband frequency synthesizer means.

Similar advantages as outlined above may be achieved through the inventive method for switching between different frequency bands in a multiband frequency generation device.

BRIEF DESCRIPTION OF DRAWINGS

Preferred embodiments of the present invention will be described with respect to the enclosed drawings in which

FIG. 5 shows a further timing chart illustrating the operation of the multiband frequency generation device according to the first embodiment of the present invention;

DESCRIPTION OF PREFERRED EMBODIMENTS

Figure 15:
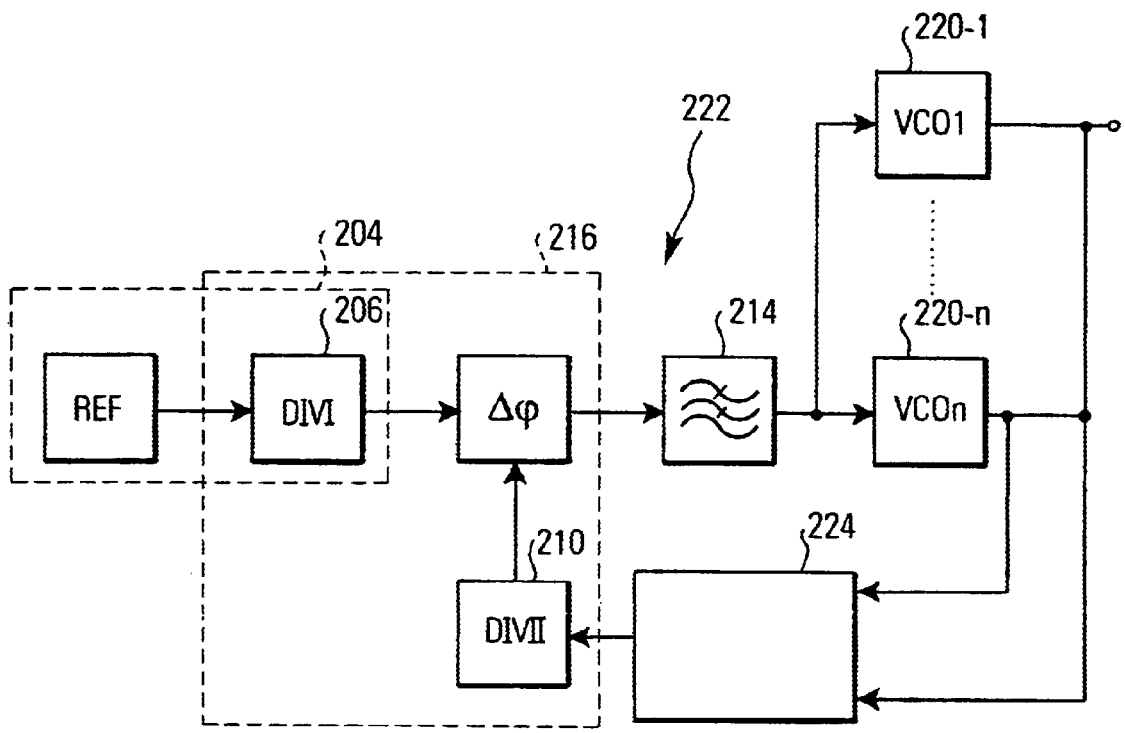
FIG. 15 shows a schematic diagram for a multiband frequency generation device to be used within the present invention.
Figure 16:
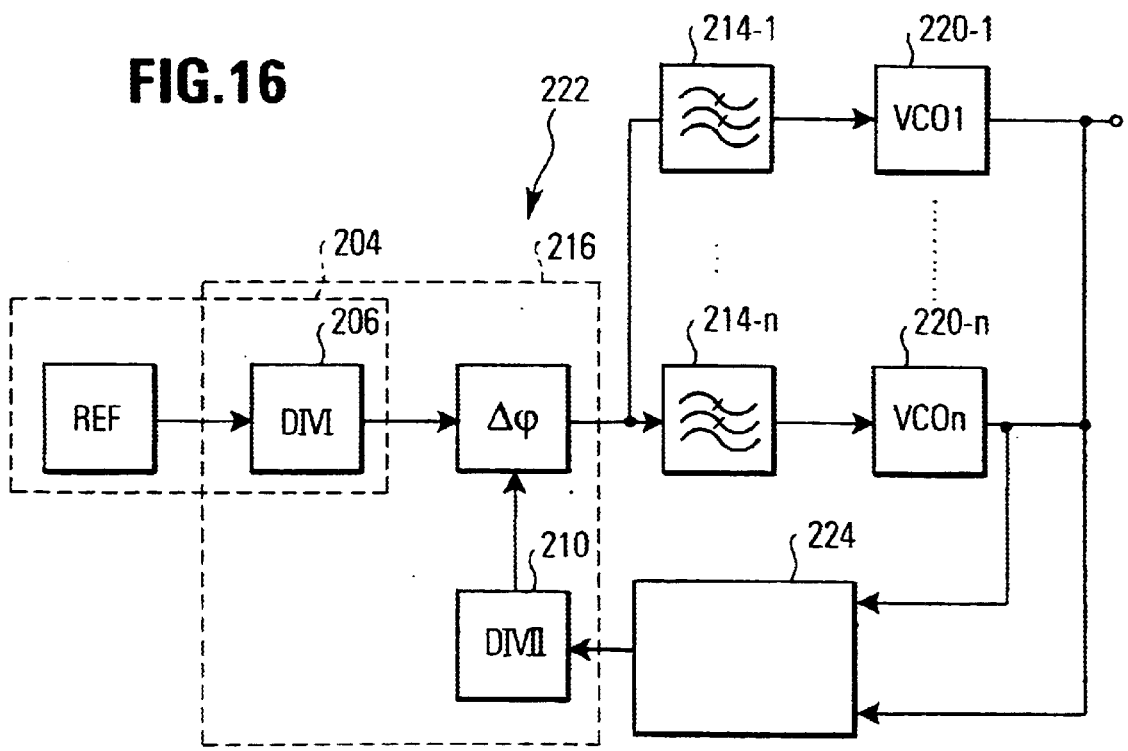
FIG. 16 shows a schematic diagram for another multiband frequency generation device to be used within the present invention.
Figure 17:
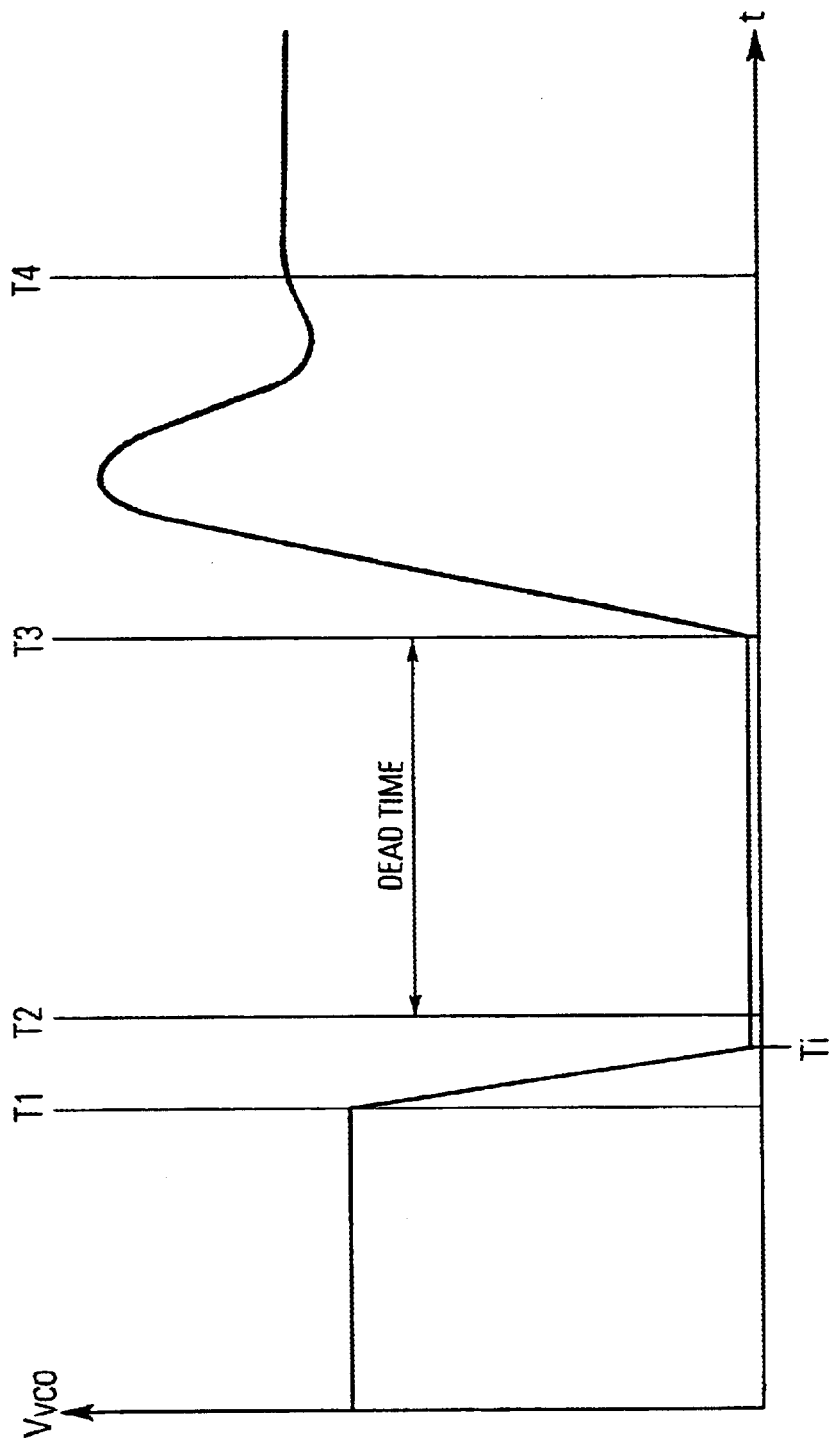
FIG. 17 shows a dead time during the transition from one frequency band to another frequency band when local oscillators are switched before programming is finished.
Figure 18:
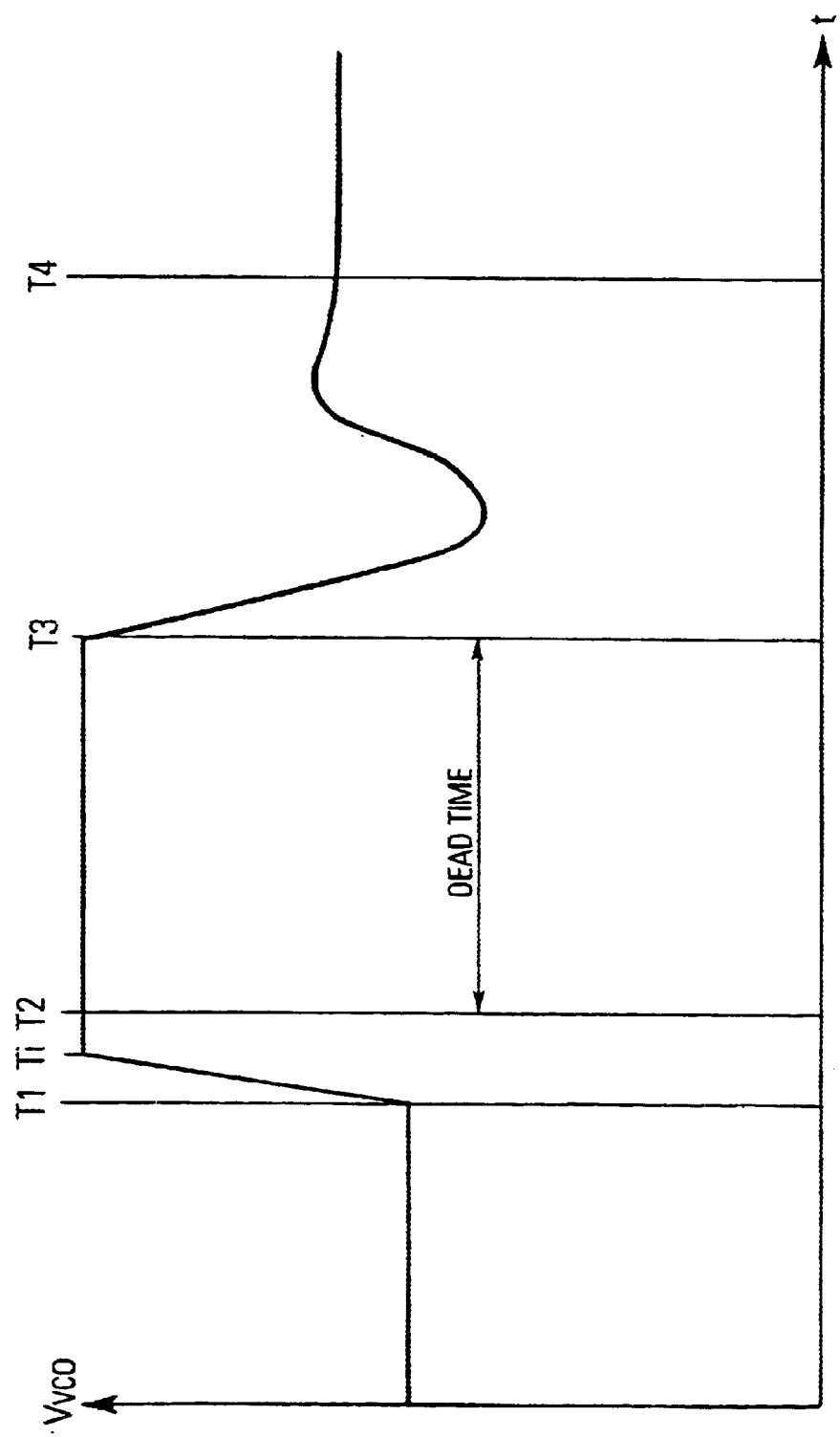
FIG. 18 shows another dead time during the transition from one frequency band to another frequency band when local oscillators are switched before programming is finished.

In the following, preferred embodiments of the present invention will be described in detail under reference to the enclosed drawings. Without restricting the scope of the present invention it may be assumed that the multiband frequency generation is carried out on the basis of the multiband frequency generation device shown in FIGS. 15 and 16, respectively.

Figure 11:
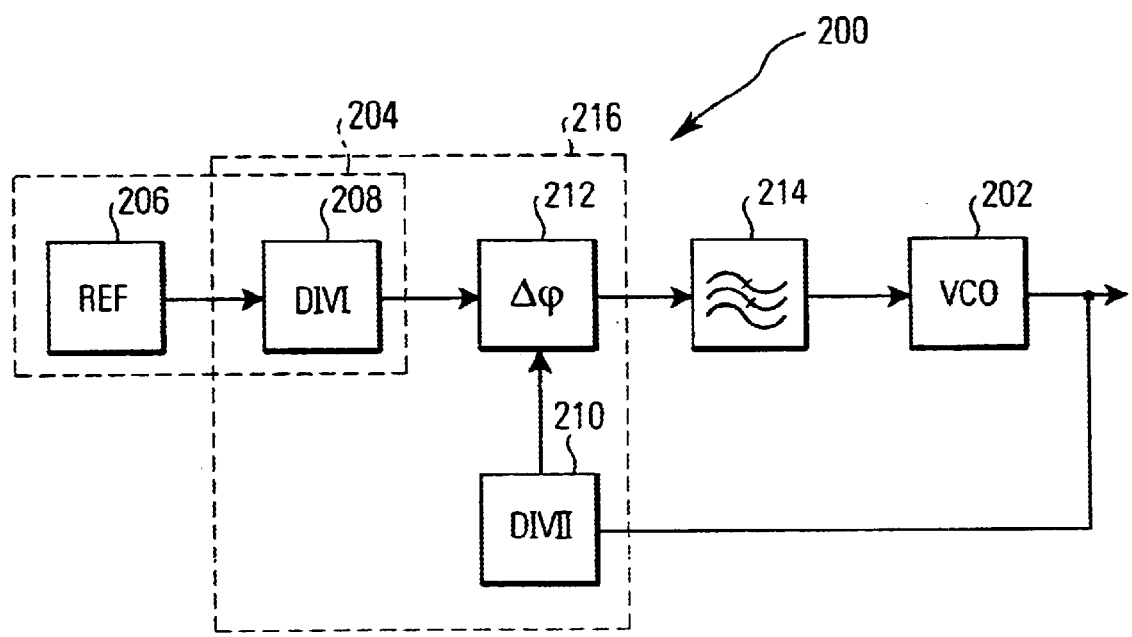
FIG. 11 shows the basic structure of a PLL control circuit for frequency generation according to the technological background of the present invention.
Figure 12:
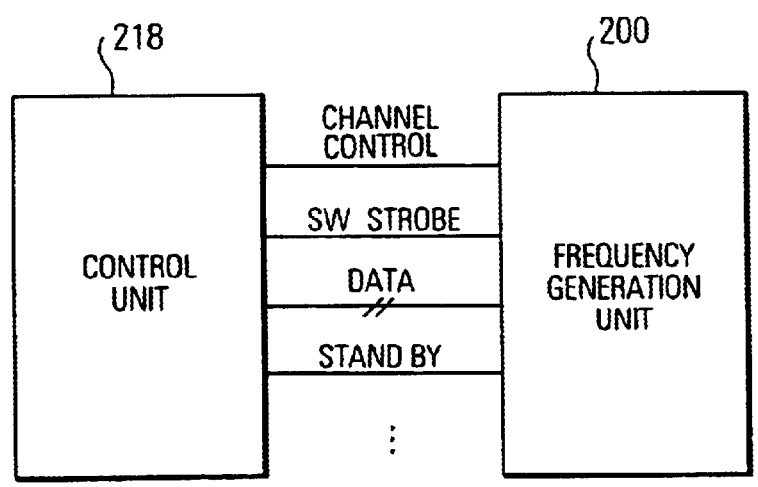
FIG. 12 shows a schematic diagram for single band frequency generation device according to the technological background of the present invention.
Figure 13:
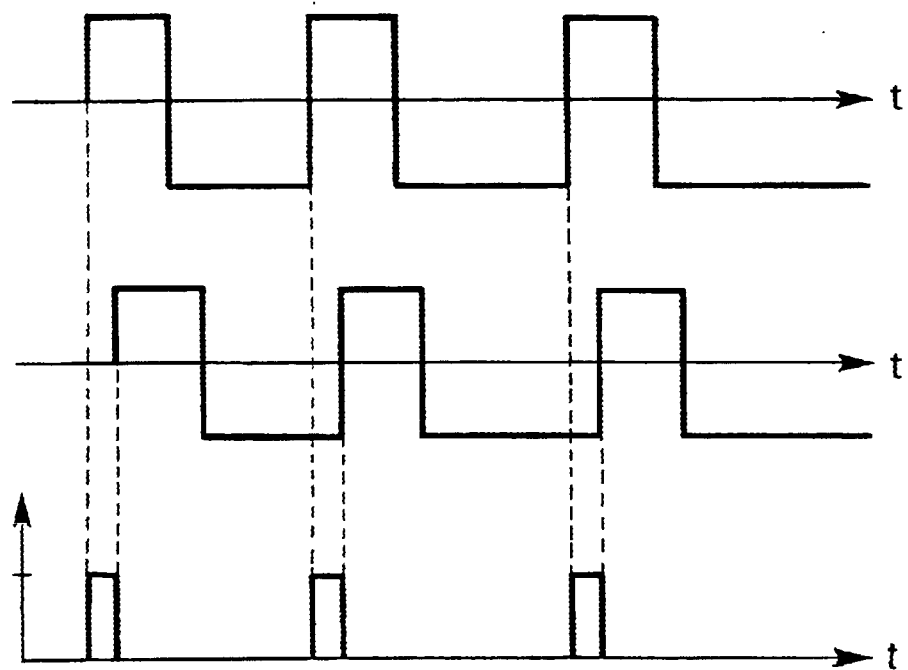
FIG. 13 and FIG. 14 show timing charts illustrating the operation of a phase detector in the PLL control circuit shown in FIG. 11.
Figure 14:
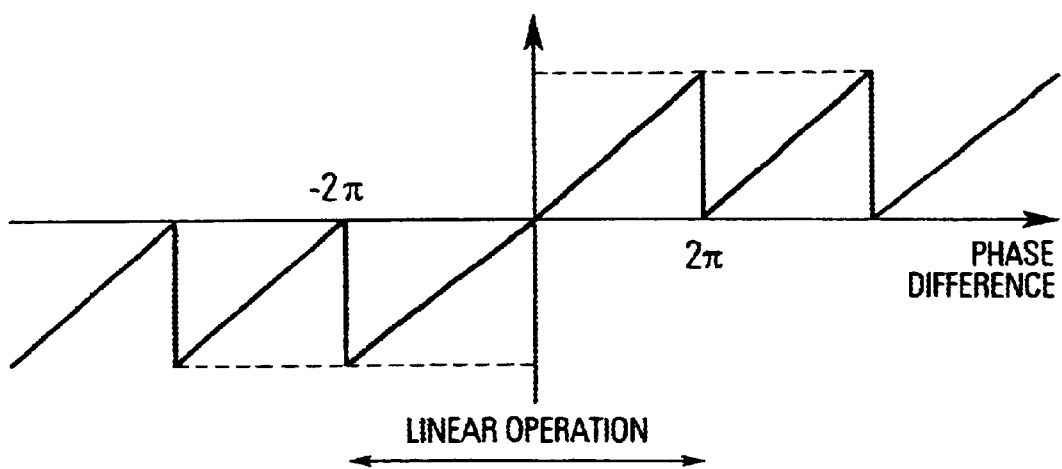

However, clearly the present invention may also be applied to a multiband frequency generation wherein a dedicated frequency generation as shown in FIG. 11 is provided for each single frequency band of the multiband frequency generation device. Also, any other structure, e.g., a combination of the frequency generation devices shown in FIGS. 11, 15, and 16, respectively, and any other suitable circuit structure may be applied within the gist of the present invention.

Figure 1:
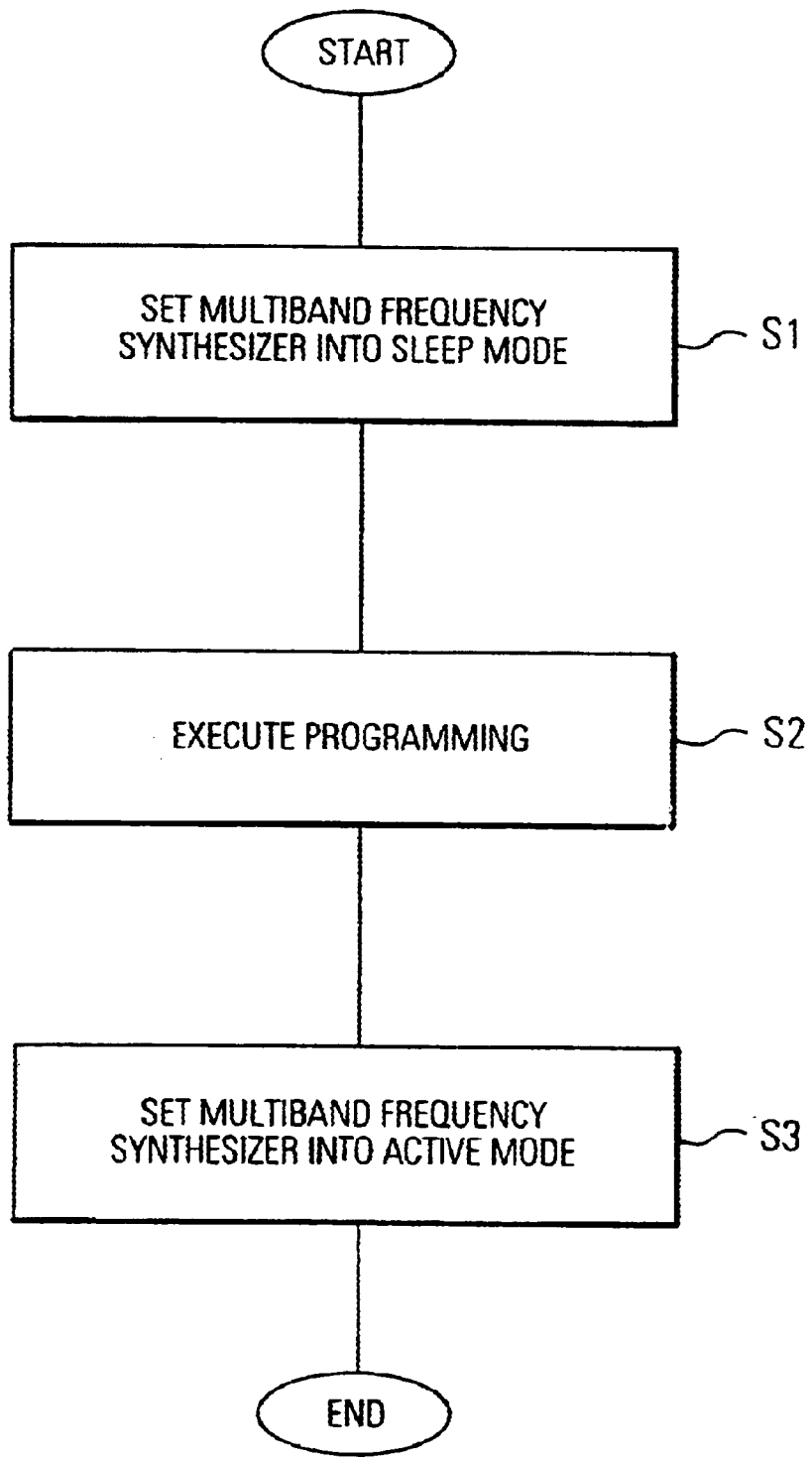
FIG. 1 shows a flowgraph diagram according to the inventive method for switching between different frequency bands in a multiband frequency generation device.

FIG. 1 shows the basic approach to the switching between different frequency bands in the multiband frequency generation device according to the different embodiments of the present invention.

Here, in step S1 a programmable multiband frequency synthesizer unit with output signals in at least two frequency bands is set into a sleep mode before switching to a new frequency band. Then, in step S2 the programming of the programmable multiband frequency synthesizer unit is carried out according to the new frequency band. In other words, this step enables the programming of the dividers in the synthesizer unit of the multiband frequency synthesizer unit. Finally, in step S3 the programmable multiband frequency synthesizer unit is set back into an active mode for operation in the new frequency band.

Figure 2:
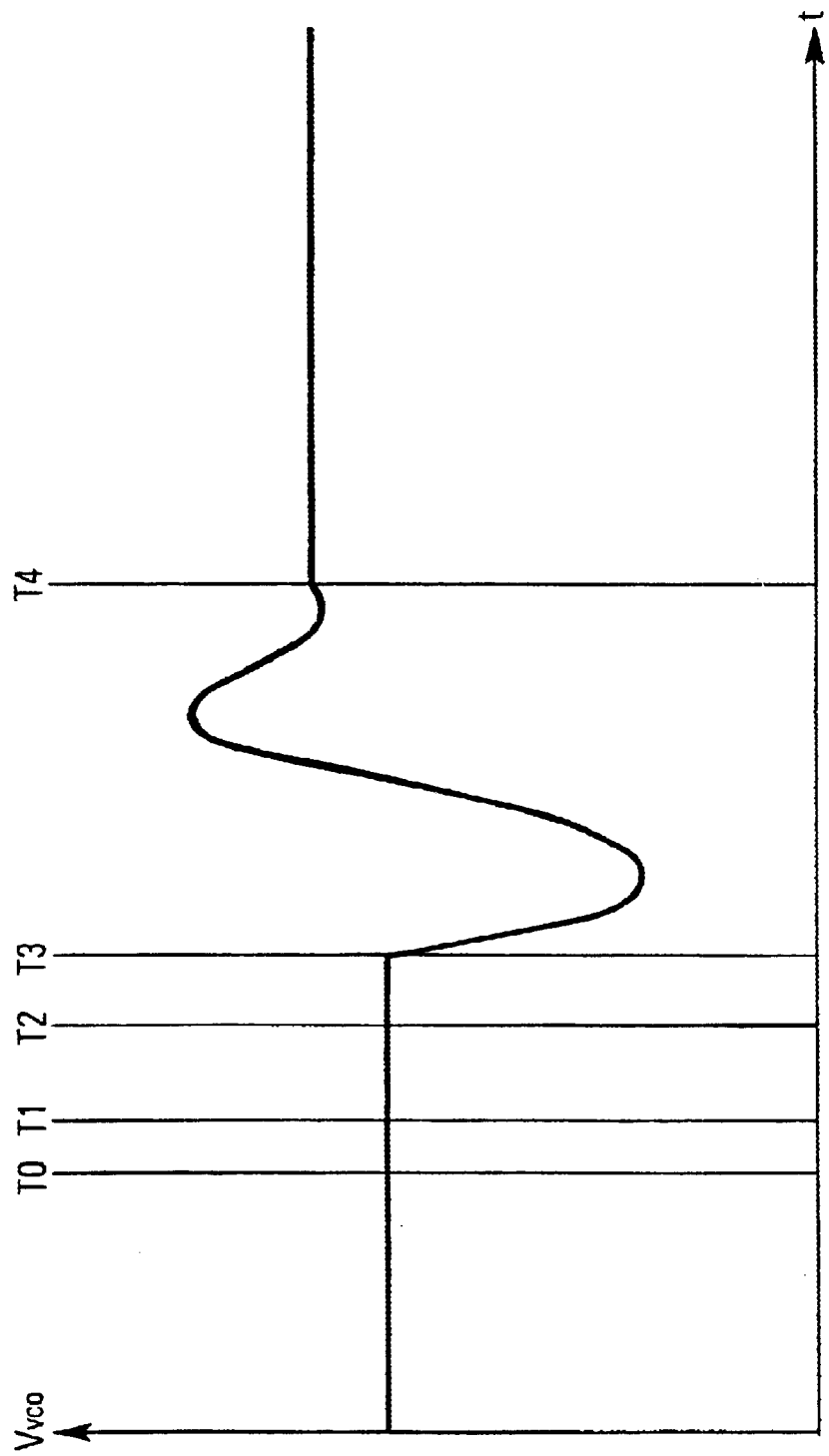
FIG. 2 shows the transition between frequency bands in the multiband frequency synthesizer means according to the present invention.

FIG. 2 shows the impact of this approach on the locking-in procedure. In particular, the different times shown in FIG. 2 may be classified as follows:

$T_0$: the programmable multiband frequency synthesizer unit is set into sleep mode;

$T_1$: the voltage-controlled oscillator associated with the old frequency band gets switched off and the voltage-controlled oscillator associated with the new frequency band gets switched on;

$T_2$: the dividers in the frequency synthesizer unit get programmed according to the new frequency band;

$T_3$: the multiband frequency synthesizer unit is put back into active mode, locking-in begins;

$T_4$: the voltage-controlled oscillator associated with the new frequency band has finally reached the required frequency.

As shown in FIG. 2, since the multiband frequency synthesizer means is set into the sleep mode during the programming thereof, any tuning of a voltage-controlled oscillator to unsuitably programmed dividers in the frequency synthesizer unit may clearly be avoided so that the charge pumps in the phase detector in the frequency synthesizer unit are not running into saturation. In consequence, locking-in may be achieved without dead time or equivalently within a significantly reduced transition time so that the locking-in time for a frequency jump between two frequency bands is in compliance with system specifications.

Figure 3:
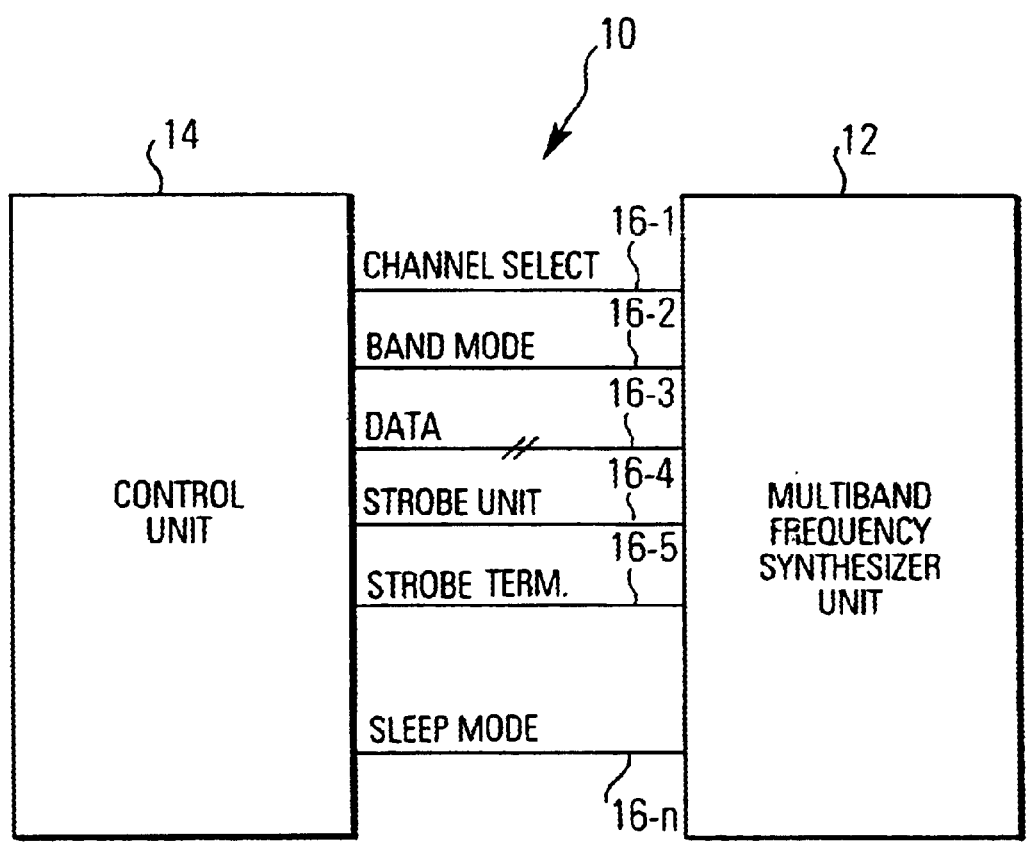
FIG. 3 shows a schematic diagram for the multiband frequency generation device according to a first embodiment of the present invention.

FIG. 3 shows a schematic diagram of the multiband frequency generation device 10 according to the present invention. The multiband frequency generation device comprises a programmable multiband frequency synthesizer unit 12 to generate an output signal in at least two frequency bands and further a control unit 14 adapted to operate and program the multiband frequency synthesizer unit 12.

As shown in FIG. 3, the control unit 14 executes the control over the multiband frequency synthesizer unit 12 via a plurality of control lines 16-1, . . . , 16-n. Here, the first control line 16-1 relates to the channel selection within a single frequency band, the control line 16-2 relates to the band selection or equivalently to the band mode of the multiband frequency synthesizer unit 12, the data line 16-3 relates to the transfer of data for the programming of the programmable dividers comprised in the multiband frequency synthesizer unit 12, the control line 16-4 relates to a strobe init control signal indicating the start of a programming, the control line 16-5 relates to a strobe terminate control signal indicating the end of a programming, and finally the control line 16-n relates to a sleep mode control signal enabling the setting of the multiband frequency synthesizer unit 12 into the sleep mode. The sleep mode control signal on the hardware level may equivalently be substituted through transfer of appropriate data to the multiband frequency synthesizer unit 12 on a software level. I.e., the strobe signals can either be hardware-based or software-based.

Further, it should be understood that this assignment clearly is only to be considered as one example out of a variety of control line assignments. One example would be to transfer the strobe init control signal and the strobe terminate control signal only via one signal control line, and so forth.

Figure 4:
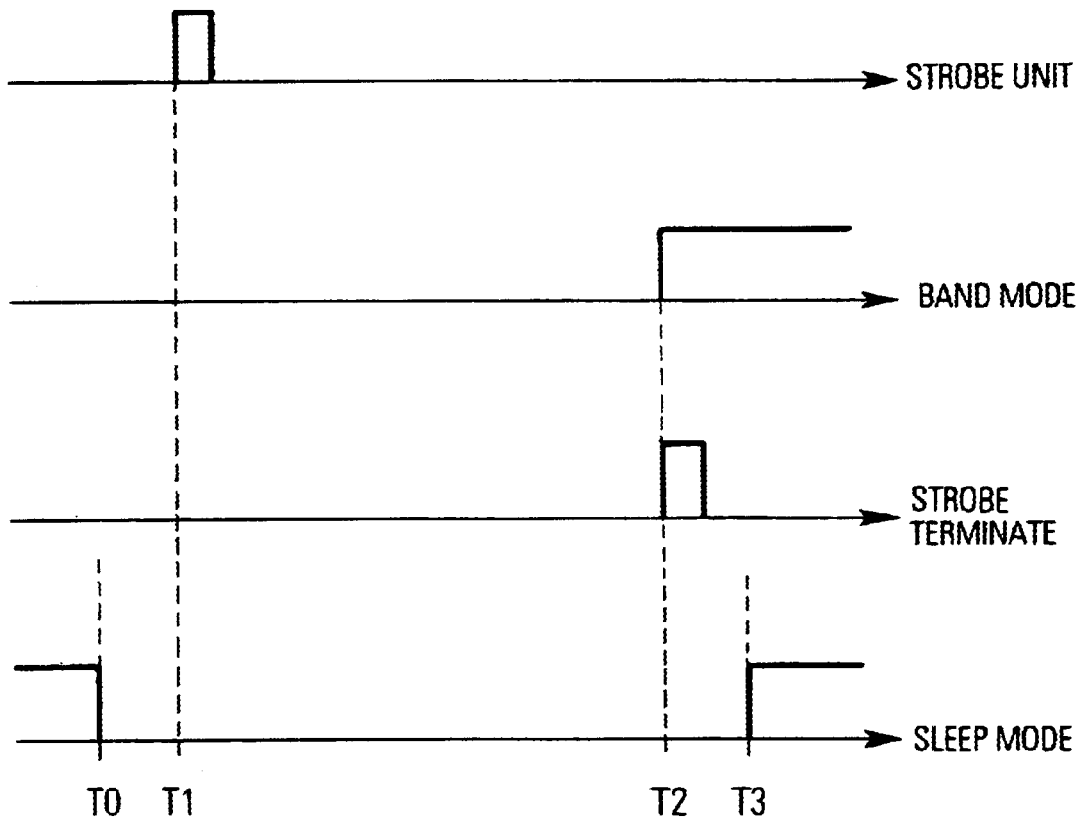
FIG. 4 shows a timing chart illustrating the operation of the multiband frequency generation device according to the first embodiment of the present invention.

FIG. 4 illustrates a timing chart for the different control signals transferred between the control unit 14 and the multiband frequency synthesizer unit 12 during reprogramming thereof. Here, the control unit 14 indicates the start of a programming of the multiband frequency synthesizer unit 12 via a strobe init signal at time $T_1$. Slightly before the programming starts, the multiband frequency synthesizer unit 12 is set into the sleep mode through the sleep mode control signal at time $T_0$. During the period from time $T_1$ to time $T_2$, programming of the dividers in the frequency synthesizer of the multiband frequency synthesizer unit 12 proceeds and the end of this programming phase is indicated via the strobe terminate signal at time $T_2$. Since now the dividers are programmed in compliance with the voltage-controlled oscillator to be activated in the new frequency band also the band mode selection signal indicating the frequency band output through the multiband frequency synthesizer unit 12 changes at time $T_2$. Finally, at time $T_3$ the sleep mode signal changes again to start the locking-in of the multiband frequency synthesizer unit 12 to the new frequency band.

FIG. 5 shows the reason why the sleep mode control signal changes only after a certain time period from time $T_2$ to time $T_3$, i.e. after the strobe term signal indicates end of programming. Typically, in practical applications the strobe term signal and the band mode signal will not change at the same time $T_2$ as for the idealistic case shown in FIG. 4 but the change of the band mode control signal will either be slightly delayed according to $\Delta T_1$ or advanced according to $\Delta T_2$ relative to the strobe term signal. The band mode control signal may even change at time $T_1$, since it is controlled by software. Therefore, the time period between time $T_2$ and time $T_3$ and also between $T_0$ and $T_1$ enables a safety margin so that a locking-in without any dead time will be guaranteed.

According to the first embodiment of the present invention shown in FIG. 3 to FIG. 5, a solution of the object underlying the present invention is achieved with no extra hardware effort through modification of the control software running in the control unit 14. To this end, during programming of the multiband frequency synthesizer unit 12 the control unit 14 uses power down options in available multiband frequency synthesizer units normally used for current saving purposes. This power down possibility is normally used during periods where the multiband frequency synthesizer unit does not output any local oscillator signal and is set in a power save state to improve the standby-talk time. Therefore, according to the present invention the power down feature being available anyway is used to avoid the dead time during a reprogramming of the multiband frequency synthesizer unit.

In the following, further embodiments of the present invention using hardware-based approaches will be described with respect to FIG. 6 to FIG. 10.

Figure 6:
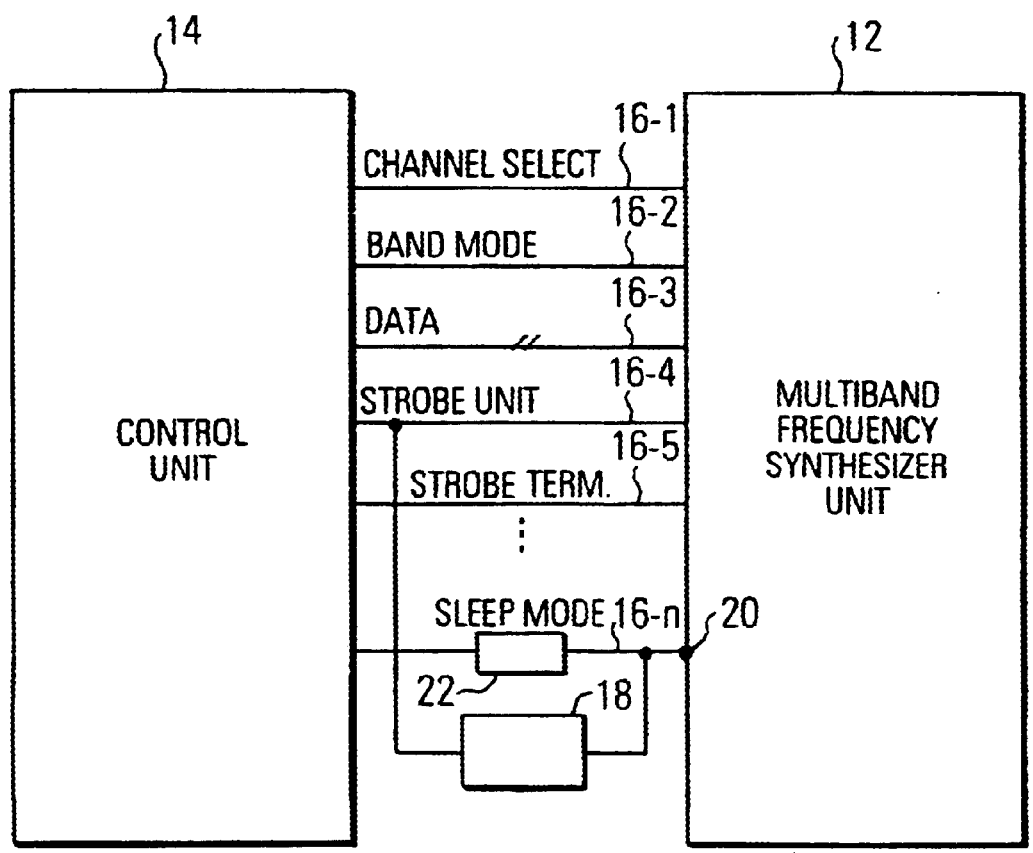
FIG. 6 shows a schematic diagram for a multiband frequency generation device according to a second embodiment of the present invention.

In particular, FIG. 6 shows a schematic diagram of the multiband frequency generation device according to the second embodiment of the present invention.

As shown in FIG. 6, according to the second embodiment there is provided a sleep mode setting unit 18 between the control unit 14 and the multiband frequency synthesizer unit 12. At its input side, this sleep mode setting unit 18 is connected to the strobe init control line 16-4 and at its output side the sleep mode setting unit 18 is connected to a power save control input terminal 20 of the multiband frequency generation unit 12. Further, a resistor 22 with a resistance value of, e.g., 10 kΩ is inserted into the sleep mode control line 16-n.

Operatively, the sleep mode setting unit 18 connects the potential at the power save control input terminal 20 to ground on receipt of the strobe init signal transferred via the strobe init control line 16-4. To decouple the sleep mode control output of control unit 14 from ground during the sleep mode there is provided the resistor 22.

Figure 7:
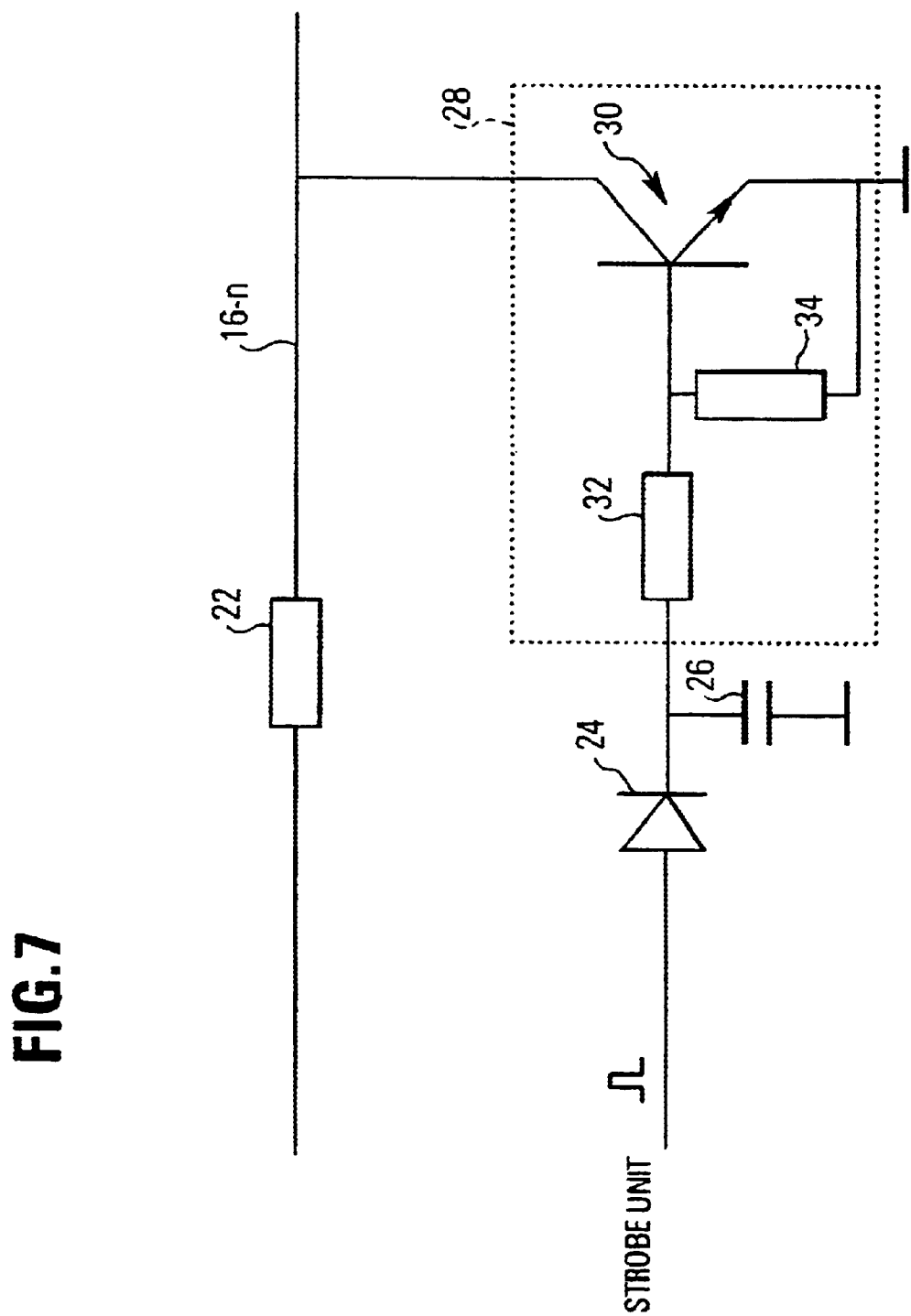
FIG. 7 shows a circuit diagram for the multiband frequency generation device according to the second embodiment of the present invention.

FIG. 7 shows a circuit diagram of the sleep mode setting unit 18 according to the present invention. It comprises a diode 24 and a first capacitor 26 that is connected between the cathode of the diode 24 and ground. In addition, at the cathode of the diode 24 there is provided a first switching unit 28 that in addition is connected to the sleep control line 16-n and ground. According to the second embodiment, this switching means is realized via an npn bipolar transistor 30. At the basis of this npn bipolar transistor there is provided a voltage divider with a first resistor 32 and a second resistor 34.

Operatively, the sleep mode setting unit 18 shown in FIG. 7 receives the strobe init signal with a short duration of, e.g., some 300 nanoseconds. This strobe init signal is transferred via the diode 24 to charge the first capacitor 26. Here, the diode 24 blocks the retransfer of the potential at the first capacitor 26 to the input terminal of the sleep mode setting unit 18.

After the first capacitor 26 has been charged the potential at the capacitor 26 is supplied to the basis of the npn bipolar transistor 30 via the voltage divider 32, 34 thus turning on the npn bipolar transistor 30 on and connecting the sleep mode control line 16-n to ground. As already outlined above, the resistor 22 is provided to decouple ground from the output terminal of the control unit 14 wherefrom the sleep mode control signal is normally supplied during stand-by of the multiband frequency generation device.

Further, since the diode 24 also has an equivalent resistance value, the strobe init signal received at the input of the sleep mode setting unit 18 is spreaded into a long pulse to turn on the switching unit 28, i.e. the npn bipolar transistor 30 comprised therein. Thus, while the sleep mode setting unit is triggered through the strobe init pulse the setting of the multiband frequency generation device to the sleep mode is achieved through spreading this strobe init pulse over the time period where the programming takes place.

The advantage of the second embodiment of the present invention is that it allows to reduce the number of control steps to be carried out in the control unit 14 since this control unit 14 only has to output the strobe init pulse and then the setting of the multiband frequency generation device 12 into the sleep mode is carried out automatically on hardware level in the sleep mode setting unit 18 shown in FIGS. 6 and 7, respectively.

Figure 8:
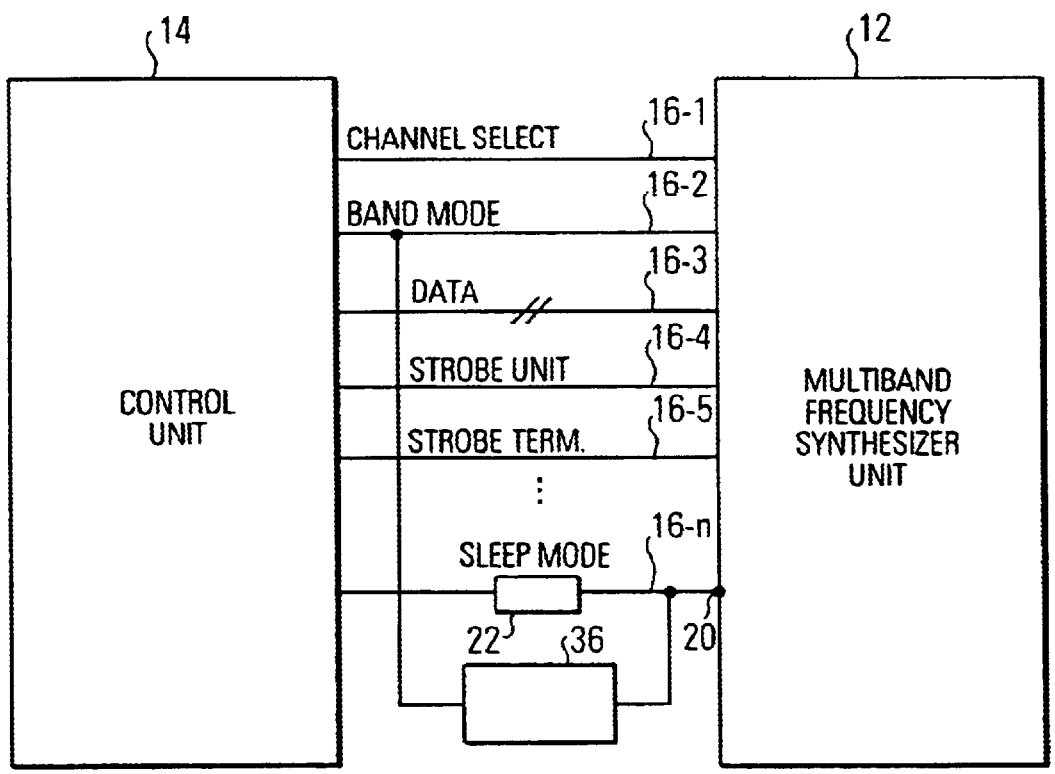
FIG. 8 shows a schematic diagram for a multiband frequency generation device according to a third and fourth embodiment of the present invention.
Figure 9:
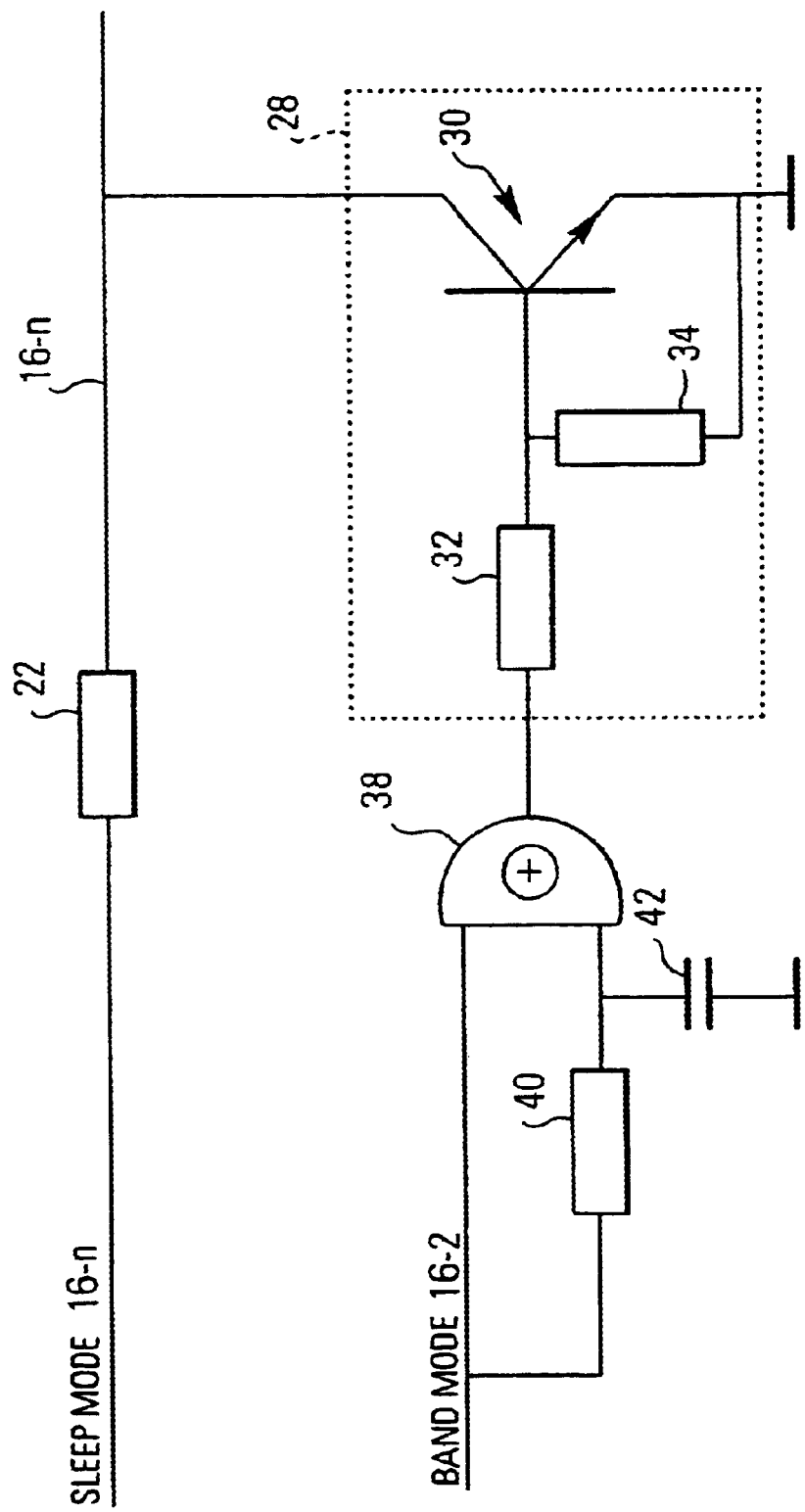
FIG. 9 shows a circuit diagram for the multiband frequency generation device according to the third embodiment of the present invention.

The same holds true for the sleep mode setting unit according to the third embodiment of the present invention and shown in FIGS. 8 and 9, respectively.

However, contrary to the first sleep mode setting unit 18 shown in FIG. 6, the second sleep mode setting unit 36 shown in FIG. 8 receives as input signal not the strobe init signal but the frequency band selection signal or equivalently the band mode selection signal. Those parts being identical to parts shown and explained with respect to FIG. 6 are denoted with the same reference numerals and explanation thereof will be omitted here.

FIG. 9 shows a circuit diagram for the sleep mode setting unit 36 shown in FIG. 8. Those parts in the sleep mode setting unit 36 being identical to the parts shown with respect to FIG. 7 are denoted with the same reference numerals and explanation thereof will be omitted here. As shown in FIG. 9, the sleep mode setting unit 36 differs over the first sleep mode setting unit 18 in that not the strobe init signal but the band mode selection signal is processed therein. In particular, the second sleep mode setting unit 36 receives the band mode signal at the input thereof and feeds this signal both directly and delayed to an exor gate 38. Here, the delay unit consists of a third resistance 40 and a second capacitor 42.

Operatively, the second sleep mode setting unit 36 shown in FIG. 9 continuously compares the level of the band mode control signal and the level of the slightly delayed band mode control signal in the exor gate 38. This allows to detect edges where the level of this band mode control signal changes and only then will the exor gate 38 output a pulse to turn on the switching unit 28.

Therefore, the advantage of this third embodiment is that the second sleep mode setting unit 36 is only activated in case a transition from one frequency band to another frequency band is actually carried out and that the sleep mode is not initiated in case the strobe init signal is activated for an intra-band channel change.

Figure 10:
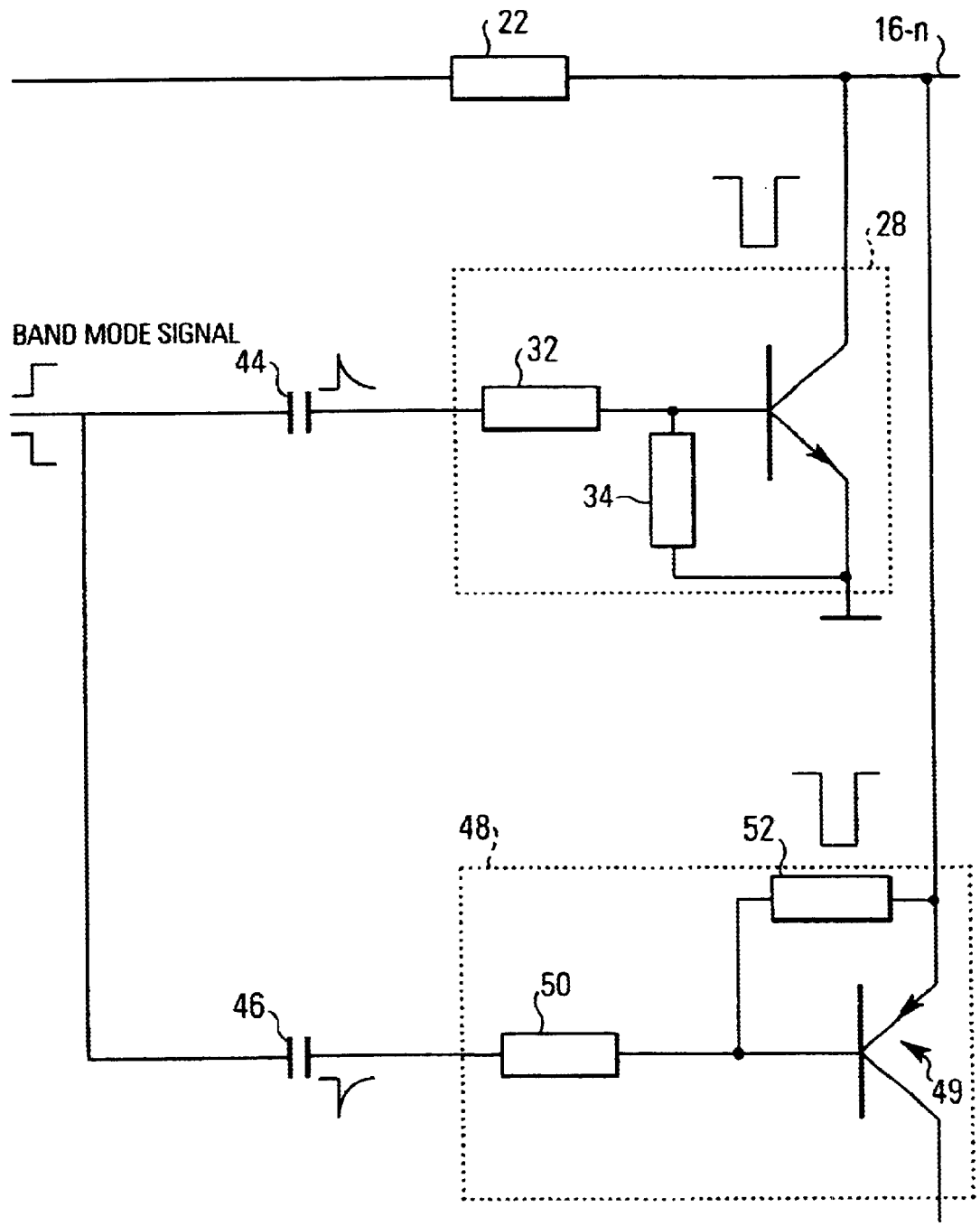
FIG. 10 shows a circuit diagram for the multiband frequency generation device according to the fourth embodiment of the present invention.

The same advantage may be achieved with the fourth embodiment of the present invention providing a third sleep mode setting means shown in FIG. 10. This third sleep mode setting means is embedded between the control unit 14 and the multiband frequency generation device in the same way as illustrated in FIG. 8, i.e. it uses the band mode control signal to connect the power save control input terminal 20 of the multiband frequency generation device 12 to ground during programming thereof.

The fourth embodiment differs over the third embodiment in that it detects the transition of the band mode control signal either from a low level to a high level or vice versa in different subcircuits as shown in FIG. 10.

To detect a transition from a low level to a high level of the band mode control signal there is provided a first branch with a third capacitor 44. This third capacitor 44 is connected in series between the input of the third sleep mode setting unit and the switching unit 28 connected between the power save control input terminal 20 and ground as explained above with respect to FIGS. 7 and 9, respectively.

As shown in FIG. 10, in addition there is provided a second branch comprising a fourth capacitor 46 connected in series between the input of the third sleep mode setting unit and a further switching unit 48. This further switching unit 48 comprises a pnp transistor 49 operating as switch. Further, a voltage divider with a third resistor 50 and a fourth resistor 52 is provided at a basis of this pnp transistor 49.

Operatively, a transition of the band mode control signal from a low level to a high level is detected in the upper branch. In particular, the third capacitor 44 carries out a differentiation thus that in case an upward level transition in the band mode selection signal takes place, a pulse is supplied to the switching unit 28 which then connects the power save control input terminal 20 to ground.

To the contrary, in case a downward transition in the band mode control signal is to be detected, this is carried out in the lower branch. Here, the edge corresponding to the downward transition is differentiated through the fourth capacitor 46 so that a pulse is generated which then turns on the further switching unit 48 to connect the power save control input terminal 20 of the multiband frequency generation device 12 to ground.

While in the above the different switching units have been described as being implemented with bipolar transistors, it should be apparent that also any other suitable switching elements such as MOS-transistors may be easily adapted to this purpose. Still further, while different features of the present invention have been described with respect to different embodiments thereof for the person skilled in the art it is clear that this explanation is not to be construed as limiting the gist of the invention but that these features may easily be combined to achieve modifications and variations within the scope of the present invention defined through the appended claims.

What is claimed is:

1. Multiband frequency generation device, comprising:
a programmable multiband frequency synthesizer to generate an output signal in at least two frequency bands,
a controller adapted to operate and program the multiband frequency synthesizer, respectively, wherein
the controller is adapted to set the multiband frequency synthesizer into a sleep mode during the programming thereof; and
the controller is adapted to initialize the sleep mode slightly before the programming of the multiband frequency synthesizer begins and to terminate the sleep mode slightly after the programming of the multiband frequency synthesizer terminates.

2. Multiband frequency generation device, comprising:
a programmable multiband frequency synthesizer to generate an output signal in at least two frequency bands,
a controller adapted to operate and program the multiband frequency synthesizer, respectively, wherein
the controller is adapted to set the multiband frequency synthesizer into a sleep mode during the programming thereof,
the multiband frequency synthesizer includes a voltage-controlled multiband oscillator to generate an output signal in each frequency band, and
the controller includes a sleep mode setting unit adapted to maintain a steering signal for the control of the voltage-controlled multiband oscillator at a constant level during the sleep mode.

3. Multiband frequency generation device, comprising:
a programmable multiband frequency synthesizer to generate an output signal in at least two frequency bands,
a controller adapted to operate and program the multiband frequency synthesizer, respectively, wherein
the controller is adapted to set the multiband frequency synthesizer into a sleep mode during the programming thereof,
the multiband frequency synthesizer includes a voltage-controlled multiband oscillator to generate an output signal in each frequency band,
the controller includes a sleep mode setting unit adapted to maintain a steering signal for the control of the voltage-controlled multiband oscillator on a constant level during the sleep mode, and
the sleep mode setting unit is adapted to set the power save control signal of the multiband frequency synthesizer in order to maintain the steering signal for the control of the voltage-controlled multiband oscillator at a constant level during the sleep mode.

4. Multiband frequency generation device, comprising:
a programmable multiband frequency synthesizer to generate an output signal in at least two frequency bands,
a controller adapted to operate and program the multiband frequency synthesizer, respectively, wherein
the controller is adapted to set the multiband frequency synthesizer into a sleep mode during the programming thereof,
the multiband frequency synthesizer includes a voltage-controlled multiband oscillator to generate an output signal in each frequency band, the controller includes a sleep mode setting unit adapted to maintain a steering signal for the control of the voltage-controlled multiband oscillator on a constant level during the sleep mode;

the multiband frequency synthesizer is of the phase-locked loop PLL type such that the steering signal for the control of the voltage-controlled multiband oscillator is an output signal of a loop filter, and the controller includes a loop filter setting unit adapted to maintain the output of the loop filter on a constant level during the sleep mode.

5. Multiband frequency generation device according to claim 4, wherein the loop filter setting unit is adapted to maintain the output of the loop filter on a constant level during the sleep mode through setting the loop filter control signal of the multiband frequency synthesizer.

6. Multiband frequency generation device, comprising:

a programmable multiband frequency synthesizer to generate an output signal in at least two frequency bands, a controller adapted to operate and program the multiband frequency synthesizer, respectively, wherein the controller is adapted to set the multiband frequency synthesizer into a sleep mode during the programming thereof, the multiband frequency synthesizer includes a voltage-controlled multiband oscillator to generate an output signal in each frequency band, the controller includes a sleep mode setting unit adapted to maintain a steering signal for the control of the voltage-controlled multiband oscillator on a constant level during the sleep mode; and the sleep mode setting unit includes programming strobe pulse spreader adapted to receive a programming strobe pulse and to spread this pulse according to a predefined time period, and first switching adapted to connect the power save control input terminal of the multiband frequency synthesizer to ground during the predefined time period in response to the output signal of the programming strobe pulse spreader.

7. Multiband frequency generation device according to claim 6, wherein the programming strobe pulse spreader comprises a diode with an anode connected to the input of the programming strobe pulse spreader and a cathode connected to the output of the programming strobe pulse spreader and a first capacitor being connected between the cathode of the diode and ground.

8. Multiband frequency generation device, comprising:

a programmable multiband frequency synthesizer to generate an output signal in at least two frequency bands, a controller adapted to operate and program the multiband frequency synthesizer, respectively, wherein the controller is adapted to set the multiband frequency synthesizer into a sleep mode during the programming thereof, the multiband frequency synthesizer includes a voltage-controlled multiband oscillator to generate an output signal in each frequency band, the controller includes a sleep mode setting unit adapted to maintain a steering signal for the control of the voltage-controlled multiband oscillator on a constant level during the sleep mode; and the sleep mode setting unit includes a first edge detector to detect a transition in a frequency band selection signal and a second switch adapted to connect the power save control input terminal of the multiband frequency synthesizer to ground during the predefined time period in response to the output signal of the first edge detector.

9. Multiband frequency generation device according to claim 8, wherein the first edge detector comprises an exor gate adapted to execute a logical exor operation with respect to the frequency band selection signal supplied directly thereto and the frequency band selection signal supplied via a delay unit, respectively.

10. Multiband frequency generation device, comprising:

a programmable multiband frequency synthesizer to generate an output signal in at least two frequency bands, a controller adapted to operate and program the multiband frequency synthesizer, respectively, wherein the controller is adapted to set the multiband frequency synthesizer into a sleep mode during the programming thereof, the multiband frequency synthesizer includes a voltage-controlled multiband oscillator to generate an output signal in each frequency band, the controller includes a sleep mode setting unit adapted to maintain a steering signal for the control of the voltage-controlled multiband oscillator on a constant level during the sleep mode; and the sleep mode setting unit includes a second edge detector to detect an upward transition in a frequency band selection signal, a third switch adapted to connect the power save control input terminal of the multiband frequency synthesizer to ground during a predefined period of time in response to the output signal of the second edge detector, a third edge detector adapted to detect a downward transition in the frequency band selection signal, and a fourth switch adapted to connect the power save control input terminal of the multiband frequency synthesizer to ground during a predefined period of time in response to the output signal of the third edge detector.

11. Multiband frequency generation device according to claim 10, wherein the second edge detector comprises a second capacitor.

12. Multiband frequency generation device according to claim 10, wherein the third edge detector comprises a third capacitor.

13. Method for switching between different frequency bands in a multiband frequency generation device, comprising:

setting a programmable multiband frequency synthesizer adapted to generate an output signal in at least two frequency bands into a sleep mode before switching to a new frequency band, programming the programmable multiband frequency synthesizer according to the new frequency band, and then setting the programmable multiband frequency synthesizer for operation in the new frequency band in an active mode, wherein the sleep mode is initialized slightly before the programming of the multiband frequency synthesizer begins and the sleep mode is terminated slightly after the programming of the multiband frequency synthesizer terminates.

14. Method for switching between different frequency bands in a multiband frequency generation device, comprising:

setting a programmable multiband frequency synthesizer adapted to generate an output signal in at least two frequency bands into a sleep mode before switching to a new frequency band, programming the programmable multiband frequency synthesizer according to the new frequency band, and then setting the programmable multiband frequency synthesizer for operation in the new frequency band in an active mode, wherein during the sleep mode a steering signal for the control of a voltage-controlled multiband oscillator of the multiband frequency synthesizer is maintained on a constant level.

15. Method according to claim 14, wherein during the sleep mode a power save control signal of the multiband frequency synthesizer is set to maintain the steering signal for the control of the voltage-controlled multiband oscillator on a constant level.

16. Method for switching between different frequency bands in a multiband frequency generation device, comprising:

setting a programmable multiband frequency synthesizer adapted to generate an output signal in at least two frequency bands into a sleep mode before switching to a new frequency band, programming the programmable multiband frequency synthesizer according to the new frequency band, and then setting the programmable multiband frequency synthesizer for operation in the new frequency band in an active mode, wherein the steering signal for the control of the voltage-controlled multiband oscillator is an output signal of a loop filter and during the sleep mode this output signal is maintained constant through setting the loop filter control signal of the multiband frequency synthesizer.

* * * * *